(12) United States Patent
Vigier-Blanc et al.

(10) Patent No.: US 7,245,834 B2
(45) Date of Patent: Jul. 17, 2007

(54) OPTICAL DEVICE FOR OPTICAL SEMICONDUCTOR PACKAGE AND FABRICATION METHOD

(75) Inventors: Emmanuelle Vigier-Blanc, Le Sappey en Chartruese (FR); Jonathan Hurwitz, Edinburgh (GB); Ewan Findlay, St. Edingburgh (GB)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/968,457

(22) Filed: Oct. 19, 2004

(65) Prior Publication Data
US 2005/0141107 A1 Jun. 30, 2005

(30) Foreign Application Priority Data
Oct. 21, 2003 (FR) .................................. 03 12305

(51) Int. Cl.
*H04B 10/00* (2006.01)
(52) U.S. Cl. ..................... 398/135; 398/182; 398/202
(58) Field of Classification Search ........ 398/135–139, 398/182–201, 202–214; 385/88–92
See application file for complete search history.

(56) References Cited

U.S. PATENT DOCUMENTS 5,925,898 A 7/1999 Spath
5,981,945 A 11/1999 Spaeth
2002/0057468 A1* 5/2002 Segawa et al. ............. 358/509
2004/0012698 A1* 1/2004 Suda et al. .................. 348/315

FOREIGN PATENT DOCUMENTS

| DE | 199 58 229.7 | 6/2000 |
| EP | 1 220 324 A2 | 7/2002 |
| EP | 1 220 324 A3 | 7/2002 |
| EP | 1 237 202 A2 | 9/2002 |
| FR | 2 822 326 | 9/2002 |
| WO | WO 01/86730 A2 | 11/2001 |
| WO | WO 01/86730 A3 | 11/2001 |
| WO | WO 01/91193 A2 | 11/2001 |
| WO | WO 01/91193 A3 | 11/2001 |

OTHER PUBLICATIONS

Preliminary French Search Report, FR 0312305, dated Jun. 25, 2004.

* cited by examiner

*Primary Examiner*—Agustin Bello
(74) *Attorney, Agent, or Firm*—Gardere Wynne Sewell, LP

(57) ABSTRACT

An optical device includes a stack having a transparent block with a rear face fixed on a front face of an integrated chip support. A front face of the transparent block that is parallel to its rear face is affixed to a rear face of a converging lens. The lens has a convex frontal surface. A diaphragm is interposed and fixed between the block and the lens. A housing for the optical device is made of an opaque material. A peripheral wall of the housing encloses the stack. An annular front part of the peripheral wall bears on a periphery of the convex frontal surface of the lens so as to define a frontal opening located in front of a central part of the lens.

36 Claims, 9 Drawing Sheets

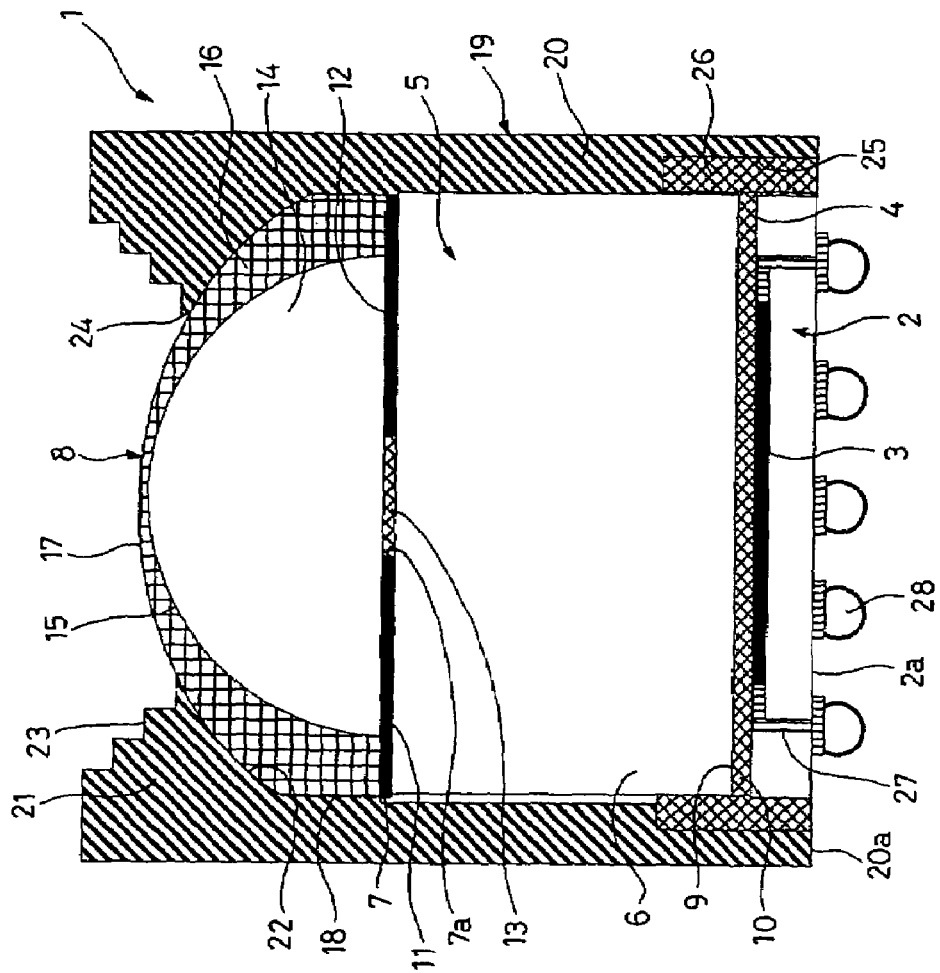
FIG_1

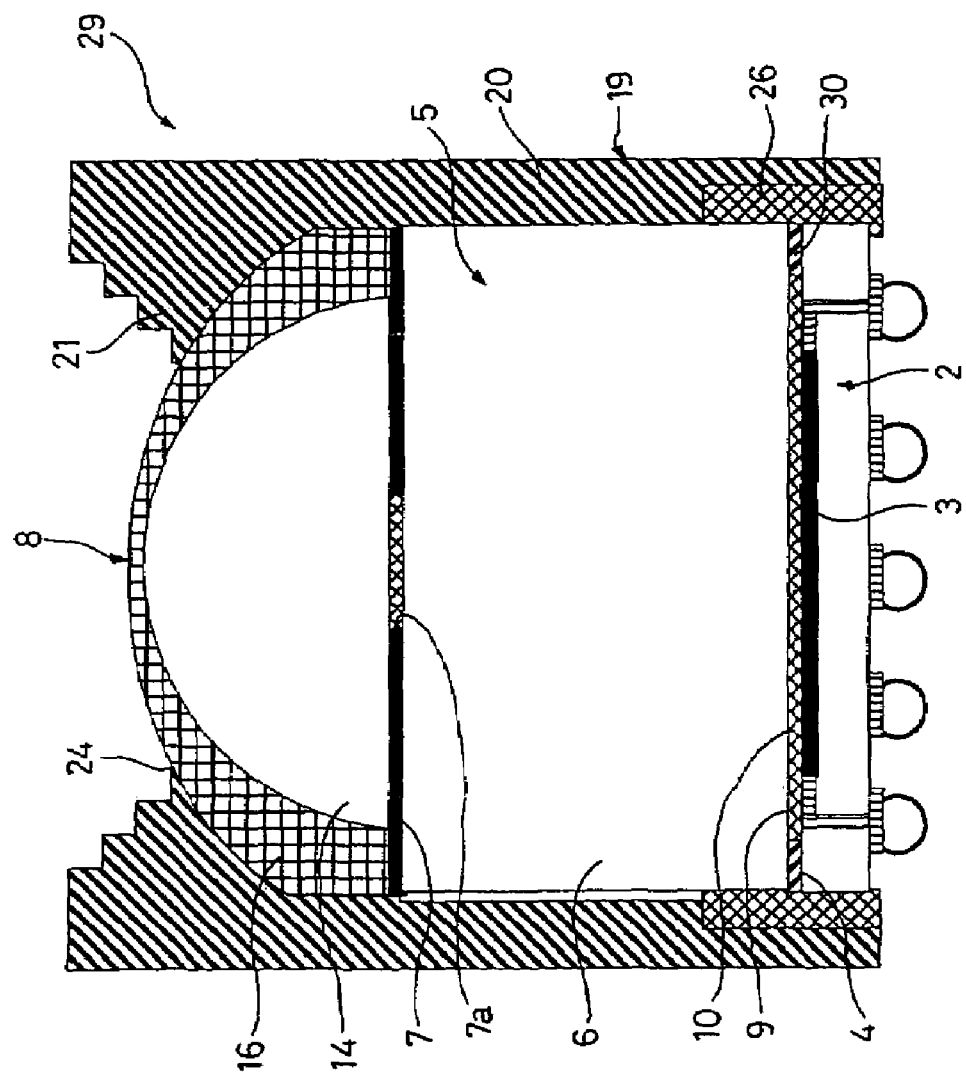
FIG_2

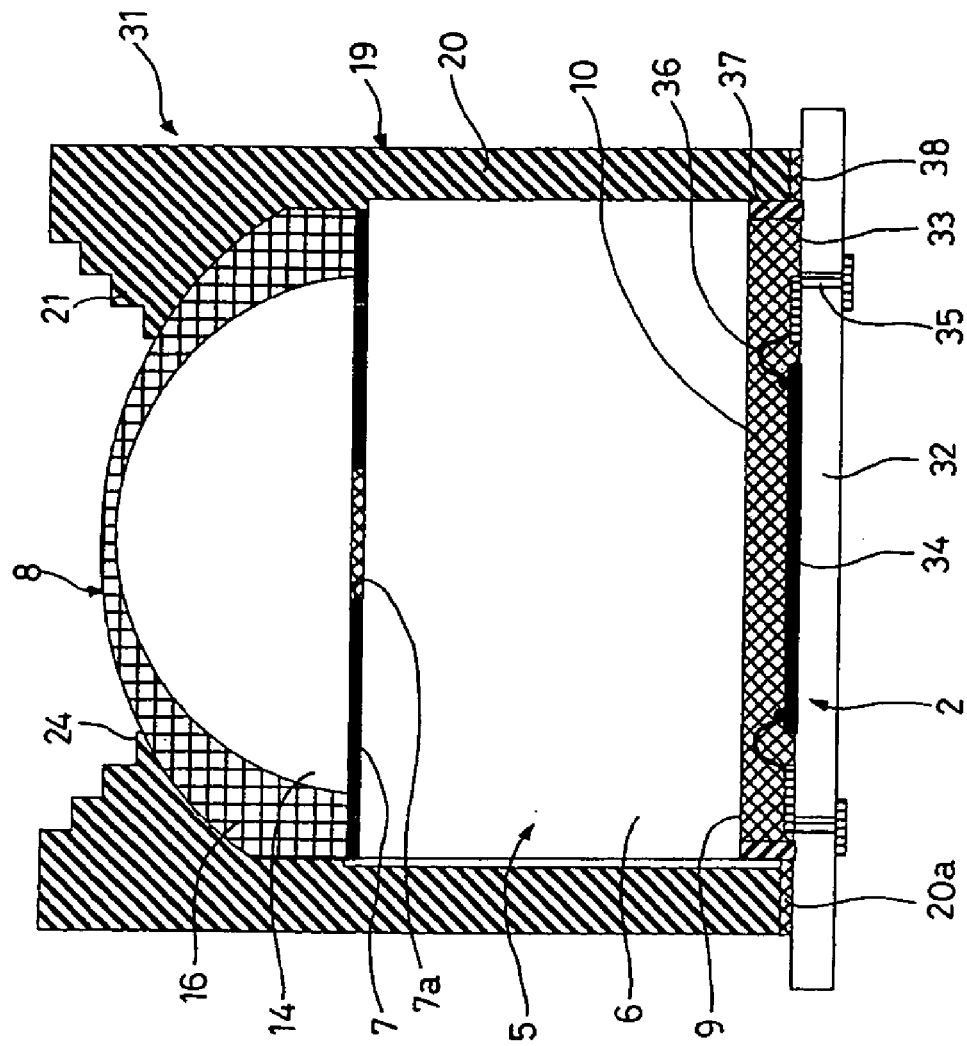
FIG_3

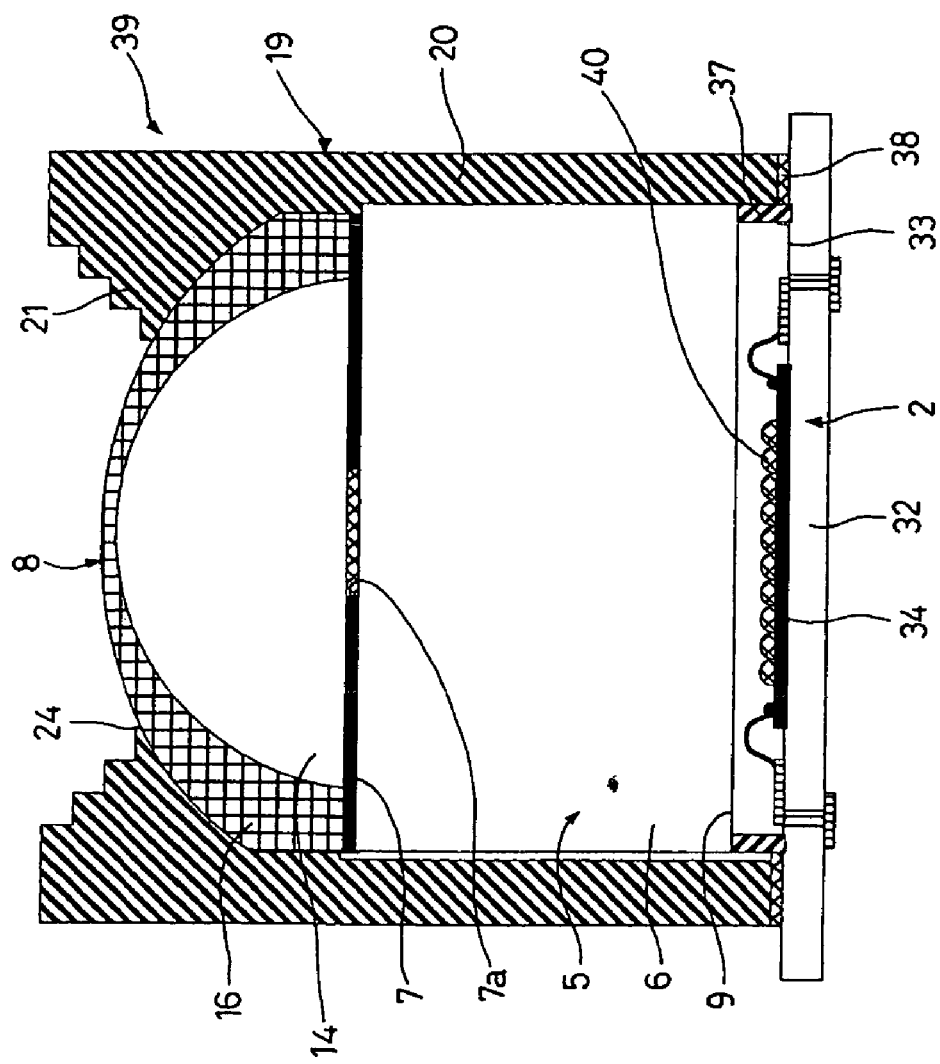
FIG_4

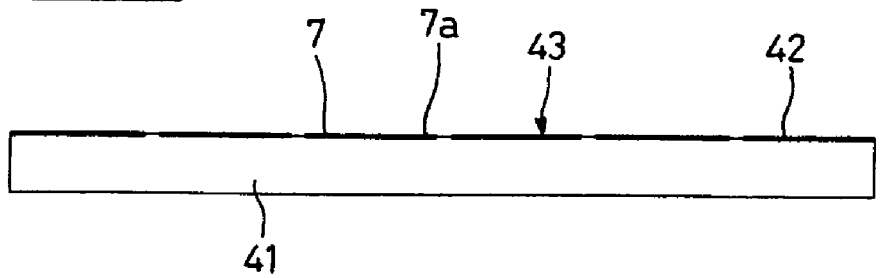
FIG_5
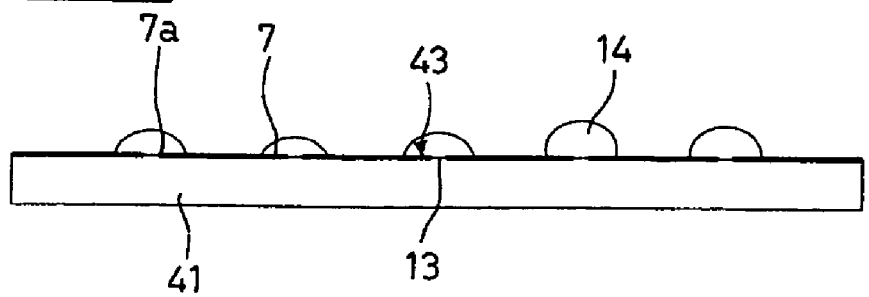
FIG_6
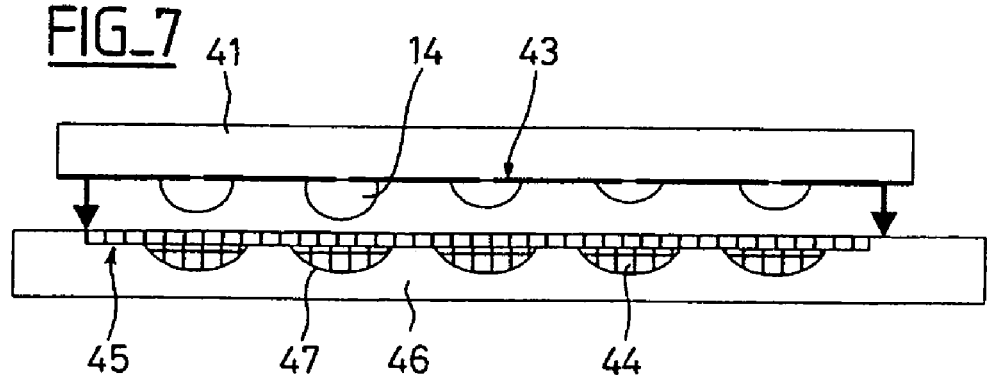
FIG_7
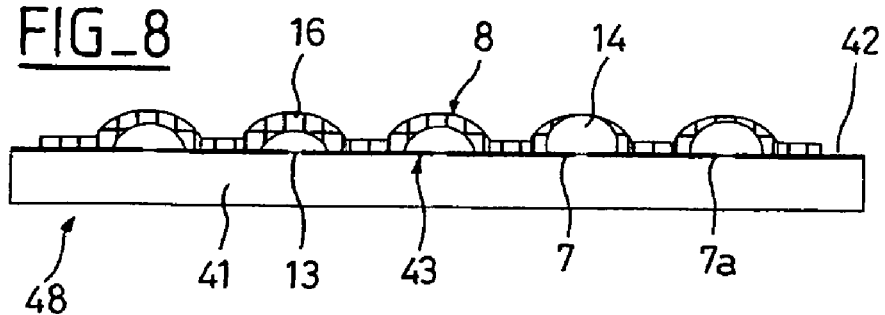
FIG_8

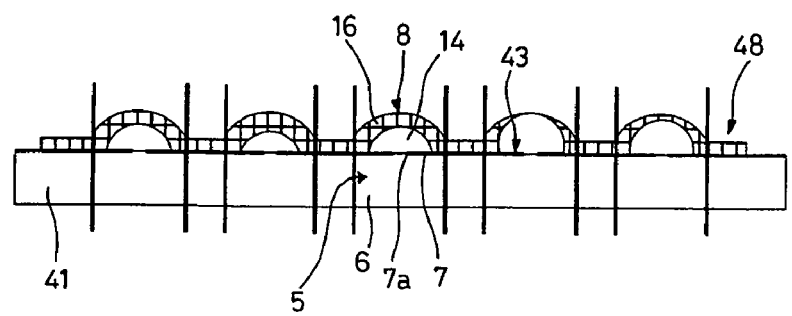
FIG_9
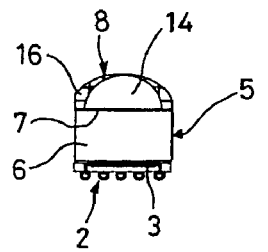
FIG_10
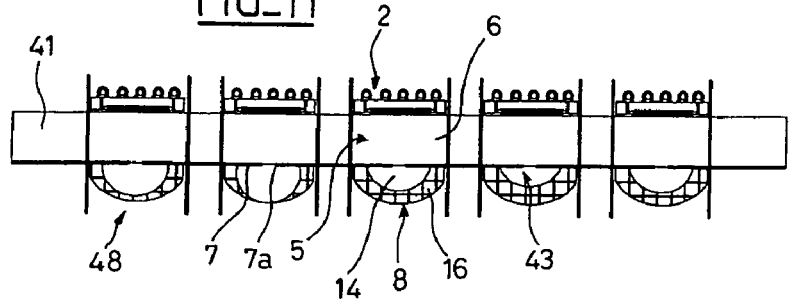
FIG_11

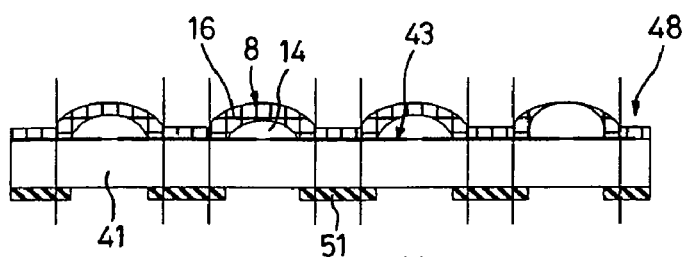
FIG_12
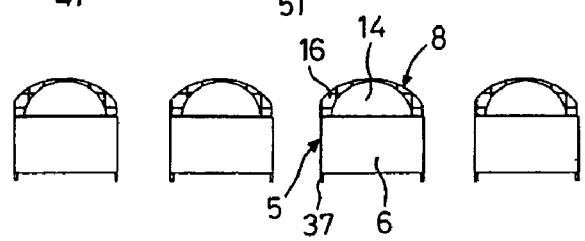
FIG_13
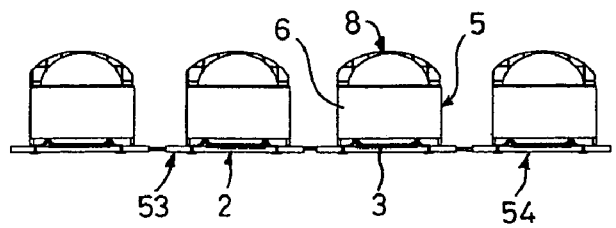
FIG_14
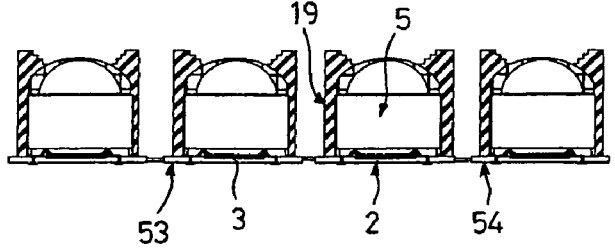
FIG_15
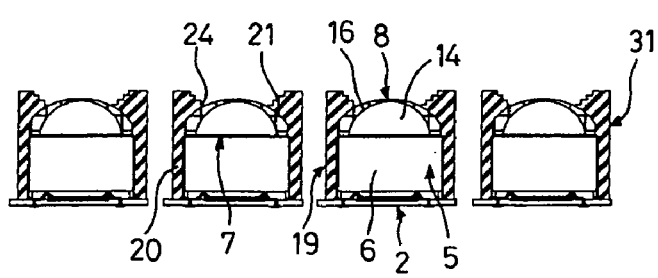
FIG_16

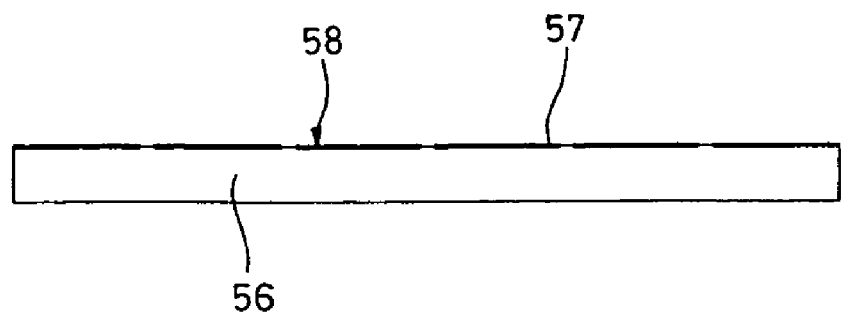
FIG_17
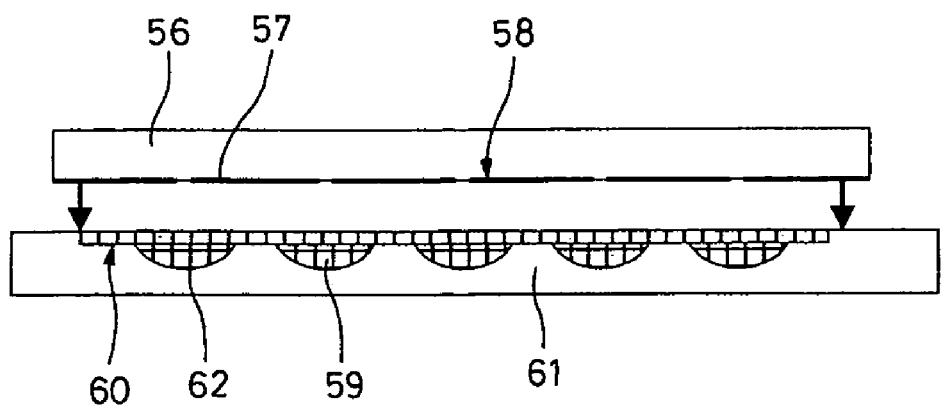
FIG_18
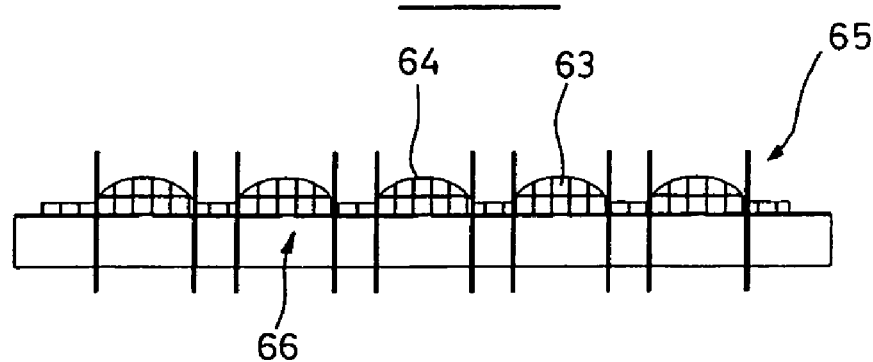
FIG_19

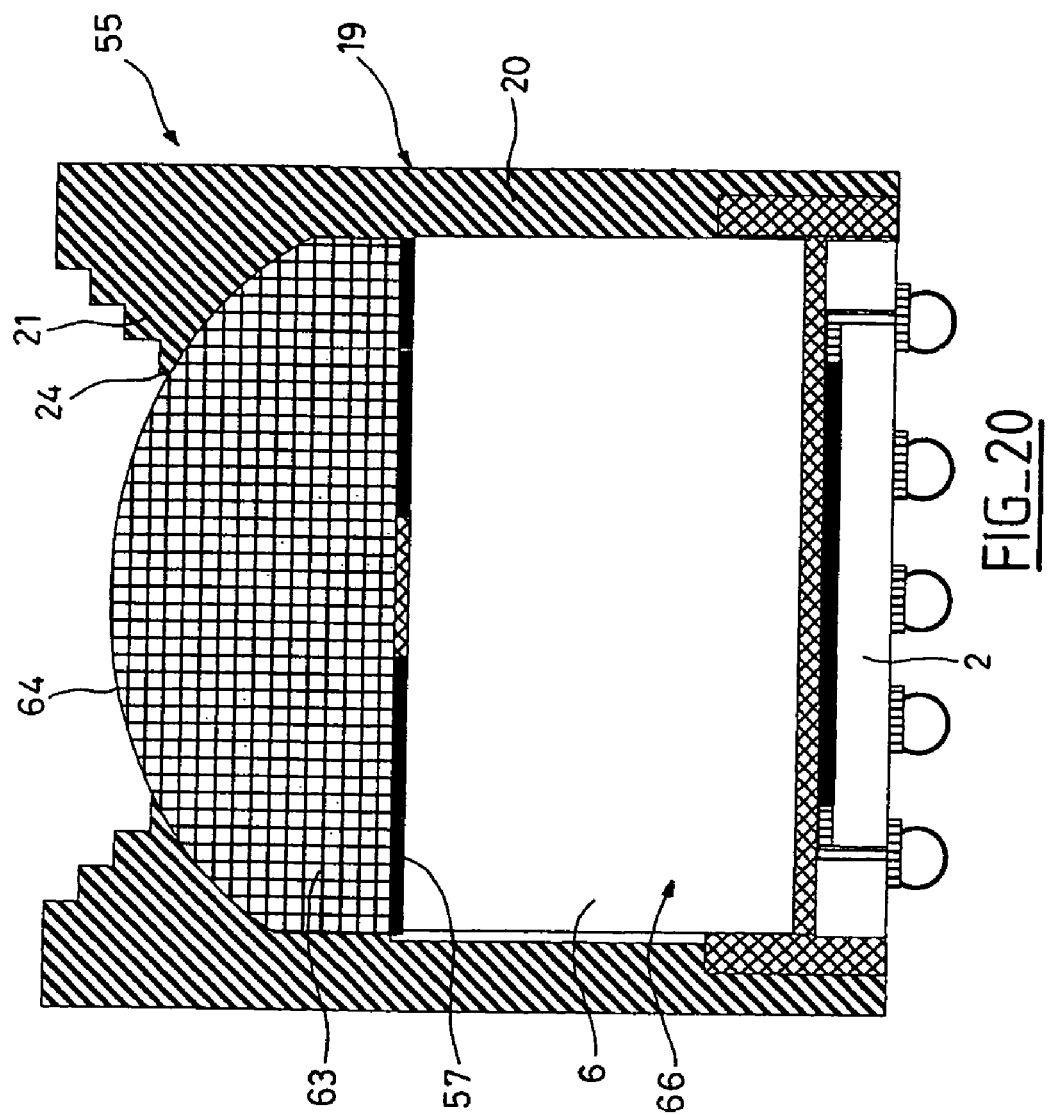
FIG_20

OPTICAL DEVICE FOR OPTICAL SEMICONDUCTOR PACKAGE AND FABRICATION METHOD

PRIORITY CLAIM

The present application claims priority from French Application for Patent No. 03 12305 filed Oct. 21, 2003, the disclosure of which is hereby incorporated by reference.

BACKGROUND OF THE INVENTION

1. Technical Field of the Invention

The present invention relates to the general field of semiconductor devices and, more particularly, to the field of semiconductor devices with optical sensors.

2. Description of Related Art

Semiconductor packages are already known which comprise a body that contains an integrated-circuit chip with an optical sensor and is used as a support, in an opening and at a distance from the optical sensor, for a glass block, a diaphragm and a lens device which is adjustable with respect to the body.

Such an arrangement requires the production of a relatively complex package body, a large number of difficult assembly operations, a final adjustment operation for the lens and a final fixing operation for the lens device. Furthermore, for reasons of cost and quality, the lens is generally made of a plastic material.

A need accordingly exists to simplify semiconductor devices with optical sensors and to improve their performance.

SUMMARY OF THE INVENTION

In accordance with an embodiment of the present invention, an optical semiconductor package comprises an integrated-circuit chip support which has an optical sensor on a front face, an optical device placed in front of the optical sensor and a housing.

According to an aspect of the present invention, the optical device comprises a stack comprising a transparent block which has a rear face fixed on the front face of the chip support and a front face parallel to its rear face. A converging lens is included which has a rear face fixed on the front face of the block and a convex frontal surface. A diaphragm is interposed and fixed between the block and the lens. The housing is furthermore made of an opaque material and comprises a peripheral wall, which encloses the stack, and an annular front part bearing on the periphery of the frontal face of the lens, so as to define a frontal opening located in front of the central part of the lens.

According to an aspect of the present invention, the convex frontal surface of the lens is preferably aspherical.

According to an alternative embodiment of the present invention, the lens is preferably monoblock.

According to another alternative embodiment of the present invention, the lens preferably comprises at least a first part, which has a substantially hemispherical frontal surface, and a second part, which is attached to at least the central part of the convex frontal surface of the first part and has an aspherical frontal surface.

According to an aspect of the present invention, the block is preferably fixed on the integrated-circuit chip support by means of a transparent adhesive layer.

According to an aspect of the present invention, the thickness of the adhesive layer is preferably calibrated.

The package according to an embodiment of the present invention may advantageously comprise a spacer interposed between the block and the chip support.

According to an aspect of the present invention, the spacer preferably comprises a ring placed around and at a distance from the optical sensor.

According to an aspect of the present invention, the diaphragm is preferably fixed between the block and the lens by means of a transparent adhesive layer.

According to an aspect of the present invention, the thickness of the adhesive layer is preferably calibrated.

According to an aspect of the present invention, the adhesive layer is preferably placed in the orifice of the diaphragm.

According to a variant of the present invention, the peripheral wall of the housing encloses the periphery of the integrated-circuit chip support.

According to another variant of the present invention, the peripheral wall of the housing extends as far as the front face of the integrated-circuit chip support.

According to an aspect of the present invention, the housing is preferably fixed on the stack by means of an annular layer.

According to an aspect of the present invention, the block is made of glass or a plastic material.

According to the present invention, the lens is made of glass or a plastic material.

According to the present invention, the chip support may advantageously comprise through-vias for electrical connection of the chip and electrical connection beads welded on the rear part of these vias.

An embodiment of the present invention also relates to an optical device placed in front of an integrated-circuit chip support, which has an optical sensor of its front face, the structure of which may advantageously correspond to that which has just been explained.

An embodiment of the present invention also relates to a method for fabricating an optical device intended to be placed in front of an optical sensor of an integrated-circuit chip.

According to an aspect of the present invention, this method comprises producing a diaphragm on one face of a block made of a transparent material, and producing a lens on the diaphragm, so that this lens is fixed on the block.

According to a variant of the present invention, the method comprises fixing a first lens part, which has a rear face on the diaphragm and a substantially hemispherical frontal surface, and in producing a second lens part by over-molding, which is attached to at least the central part of the convex frontal surface of the first part and has an aspherical frontal surface.

According to a variant of the present invention, the method consists in producing a monoblock lens by direct molding on the diaphragm.

According to a variant of the present invention, the method comprises fixing an optical device obtained on each location of a plate, which comprises an integrated-circuit chip in each of these locations, and then cutting this plate in order to separate each optical device provided with an integrated-circuit chip.

According to another variant of the present invention, the method comprises producing diaphragms on the locations of one face of a plate made of a transparent material, producing lenses on the diaphragms at the locations, and cutting the plate so as to obtain an optical device corresponding to each location.

According to an aspect of the present invention, the method comprises fixing an integrated-circuit chip support on the opposite face of the block from the diaphragm, before the cutting operation.

According to a variant of the present invention, the method comprises fixing an integrated-circuit chip support on the opposite face of the block from the diaphragm, after the cutting operation.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 is a cross section of a package according to the invention;

FIG. 2 is a cross section of another package according to the invention;

FIG. 3 is a cross section of another package according to the invention;

FIG. 4 is a cross section of another package according to the invention;

FIGS. 5 to 8 illustrate first steps for fabrication of the packages;

FIGS. 9 and 10 illustrate subsequent steps for fabrication of the packages according to an alternative embodiment;

FIG. 11 illustrates a subsequent step for fabrication of the packages according to another alternative embodiment;

FIGS. 12 to 16 illustrate subsequent steps for fabrication of the packages according to another alternative embodiment; and FIGS. 17 to 20 illustrate steps for fabrication of the packages according to another alternative embodiment.

DETAILED DESCRIPTION OF THE DRAWINGS

Referring to FIG. 1, it can be seen in that an optical semiconductor package 1 has been represented which comprises an integrated-circuit chip support 2 of flat and square shape, which has an optical sensor 3 substantially in the middle of its front face 4.

Above the front face 4 of the integrated-circuit chip support 2, the package 1 comprises a stack 5 (also referred to herein as an optical device 5) successively comprising a transparent glass block 6, a diaphragm 7 and an optical device 8, the outlines of which are square and correspond substantially to that of the integrated-circuit chip support 2, the optical axis of this optical device 5 corresponding to the optical axis of the optical sensor 3 of the integrated-circuit chip support 2.

The transparent glass block 6 has a rear face 9, which is fixed on the front face 4 of the support 2 by means of a transparent adhesive layer 10, and a front face 11 parallel to its rear face 9.

The diaphragm 7 is interposed between the front face 11 of the block 6 and a rear face 12 of the lens 8, the latter being fixed by means of a transparent adhesive layer 13 which substantially fills the central opening 7a of the diaphragm 7.

The lens 8 comprises a central first part or core 14, the diameter of which is smaller than the dimension of the frontal face 11 of the block 6 and which has a substantially hemispherical frontal surface 15, as well as an aspherical second part 16 attached to the frontal surface 15 of the first part 14, the second part 16 having a spherical frontal surface 17, the diameter of which is greater than the diameter of the hemispherical first part 14, and having side faces 18.

The package 1 furthermore comprises a tubular housing 19 made of an opaque plastic material, which comprises a rectangular peripheral wall 20 that encloses the support 2 and the stack 5, and an annular front part 21 which has a rear surface 22 that bears on the periphery of the frontal surface 17 of the lens 8 and is of the same shape, and a stepped front surface 23, thus delimiting a frontal opening 24. The rear face 20a of the housing 19 lies substantially in the plane of the rear face 2a of the support 2.

The peripheral wall 20 of the housing 19 has an annular inner recess 25 at the rear, in which is inserted an annular layer 26 of fixing adhesive that engages with the periphery of the integrated-circuit chip support 2 and the rear part of the periphery of the block 6.

The support 2 has integrated vias 27 for electrical connection of the optical sensor 3, which open towards the rear, and electrical connection beads 28 connected to the rear ends of the vias 27.

Referring to FIG. 2, it can be seen that an optical semiconductor package 29 has been represented which only differs from the package 1 represented in FIG. 1 in that an annular spacer 30 is interposed between the peripheral part of the front face 4 of the integrated-circuit chip support 2 and the peripheral part of the rear face 9 of the block 6, so as to fix the spacing between them, the transparent adhesive layer 10 extending inside this annular spacer 30.

Referring to FIG. 3, it can be seen that a package 31 has been represented which essentially differs from those represented in FIGS. 1 and 2 in that the integrated-circuit chip support 2 comprises an electrical connection support plate 32, on the front face 33 of which an integrated-circuit chip 34 having optical sensor on its frontal face is fixed by adhesive bonding.

The support plate 32 has through-vias 35 for electrical connection, the front ends of which are connected to the integrated-circuit chip 34 by means of electrical connection wires 36.

Similarly as in the example of FIG. 2, an annular spacer 37 is interposed between the front face 33 of the plate 32 and the periphery of the rear face 9 of the block 6, this spacer 37 being long enough for the electrical connection wires 36 to be embedded in the transparent adhesive layer 10 which fixes the chip 6 of the support 2 inside the spacer 7.

The support plate 32 is large enough to extend in front of the rear end 20a of the housing 19, the latter being fixed by means of an adhesive layer 38 interposed between the rear face 20a of the housing 19 and the front face 33 of the support plate 32.

Referring to FIG. 4, it can be seen that a package 39 has been represented which differs from the package represented in FIG. 3 only in that the frontal face of the integrated-circuit chip 34 is provided with a multiplicity of substantially hemispherical microlenses 40 at least on its optical sensor.

The optical semiconductor packages which have just been described may be fabricated in a variety of ways, which will now be described.

As shown by FIG. 5, starting with a glass plate 41, an opaque layer 42 having various locations 43 for the through-vias 7a at the center, which are distributed in a square matrix so as to constitute diaphragms 7 later on, is produced on a face of this plate.

As shown by FIG. 6, a hemispherical glass part 14 is fixed on each location 43 of the plate 41 by means of an adhesive layer 13. The hemispherical glass parts 14 are advantageously obtained by cutting spherical glass beads in two.

As shown by FIG. 7, the hemispherical parts 14 are dipped by moving the plate 41 downwards in a molten glass bath 44 contained in a cavity 45 of an embossed plate 46, the cavity 45 having a multiplicity of aspherical hollow cells 47 which are placed in correspondence with the locations 43, and the radius of which corresponds to the frontal face 17 of the attached second part 16.

After cooling, an assembly 48 is obtained which comprises the glass plate 42 provided with a diaphragm 7 and a lens 8 at each location 43, with thin glass connection portions 49 joining them around the lenses 8.

According to a variant of the fabrication as shown by FIG. 9, the assembly 48 may be cut, for example by sawing in a square matrix, so as to obtain a stack 5 at each location 43.

A subsequent step may consist in taking each separated stack 5 and fixing it on an integrated-circuit chip support 2 by means of a transparent adhesive layer 10, as described with reference to FIG. 1, so as to obtain an assembly 49 as shown by FIG. 10.

A subsequent step consists in taking this assembly 49 and in inserting it into the housing 19 and in assembling them by forming the ring of adhesive 26. The package 1 represented in FIG. 1 is thus obtained.

According to FIG. 11, another alternative embodiment may consist in fixing an integrated-circuit chip support 2 on locations 50 of the assembly 48, opposite the locations 43, by means of a transparent adhesive layer 10, then in cutting the glass plate 41 by sawing so as to obtain the assembly 49 represented in FIG. 10, the subsequent step consisting in installing the housing 19 on this assembly 49 as before.

According to another variant which is represented in FIG. 12, projecting parts 51, which are to constitute the spacers 30 or 37 later on, may be formed on the rear face of the assembly 48.

Next, as shown by FIG. 13, the assembly 48 is cut so as to obtain a stack 6, provided with a spacer 30 or 37, at each location 43.

The package 29 represented in FIG. 2 can then be produced according to that which was described above with reference to production of the package 1 represented in FIG. 1.

In a variant which is represented in FIG. 14, assemblies 52 may be fixed on locations 53 of a plate 54, in which locations integrated-circuit chip supports 2 corresponding to those in FIGS. 3 and 4 are produced, for example in a square matrix, as was described with reference to these figures.

Next, as shown by FIG. 15, a housing 19 is fitted on each stack 5 carried by the plate 54 and is fixed by means of an adhesive layer 38.

This having been done, as shown by FIG. 16, the plate 54 is cut in order to separate the packages 31 or 39 as represented in FIGS. 3 and 4.

Referring to FIGS. 17 to 20, another alternative embodiment of a semiconductor package 55 will now be described.

As shown by FIG. 17, starting with a glass plate 56, a multiplicity of diaphragms 57 are produced at locations 58 on one of its faces, as described above with reference to FIG. 5.

Next as shown by FIG. 18, the face of the plate provided with the diaphragms 57 is brought by moving the plate 41 downwards onto a molten glass bath 59 contained in a cavity 60 of an embossed plate 61, the cavity 60 having a multiplicity of aspherical hollow cells 62 which are placed in correspondence with the locations 58.

As shown by FIG. 19, lenses 63 are thus obtained directly and in situ above the diaphragms 57, on each location 58, the frontal face 64 of which lenses corresponds to the bottom of the cells 62 and is aspherical.

The assembly 65 obtained in this way may then be used as described in the previous examples.

The plate 56 may in particular be cut so as to obtain, by separation, stacks 66 corresponding to each location 58 and to the layouts described above, in order to obtain the package 55 which is represented in FIG. 20 and corresponds to the package described with reference to FIG. 1.

The structures of optical semiconductor packages, and the ways of fabricating them, which have just been described have numerous advantages.

While being made of glass, the lens 8 is designed to have good optical characteristics, with the attached part 16 correcting the defects of the hemispherical base part 14 which are due to the latter being obtained by cutting a sphere.

The block 6, the lens 8 and the lens 63 could also be made of a plastic material, optionally a composite plastic material.

The lens 8 or the lens 63 can already be positioned with respect to the optical sensor 3 during assembly, because the thicknesses of the elements constituting the stack 5 can be produced with precision, the thickness of the adhesive layer 4 can be calibrated and the thicknesses of the spacers 30 and 37 can be produced with precision.

The optical housing 19, which is not involved in the positioning of the stack 5 with respect to the optical sensor 3, can be produced without difficulty and using a standard opaque plastic material.

The semiconductor packages which are obtained are suitable for being processed in reflow ovens, which are used for reflow soldering of the beads 28 with a view to fixing them on printed circuits.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An optical semiconductor package, comprising:
    an integrated-circuit chip support which has an optical sensor on a front face;
    an optical device placed in front of and attached to the front face of the chip support for the optical sensor; and
    a housing;
    the optical device comprising a stack which comprises:
        a transparent block which has a rear face attached to the front face of the chip support and a front face parallel to its rear face;
        a converging lens which has a rear face and a convex frontal surface; and
        a diaphragm interposed and fixed between the block and the lens, a first face of the diaphragm being attached to the front face of the transparent block and a second face of the diaphragm being attached to the rear face of the converging lens; and
    the housing being made of an opaque material and comprising a peripheral wall, which encloses the stack, and an annular front part bearing on a periphery of the frontal surface of the lens, so as to define a frontal opening located in front of a central part of the lens.

2. The package according to claim 1, wherein the convex frontal surface of the lens is aspherical.

3. The package according to claim 1, wherein the lens is monoblock.

4. The package according to claim 1, wherein the lens comprises at least a first part, which has a substantially hemispherical frontal surface and the rear face attached to the diaphragm, and a second part, which has an aspherical frontal surface and a substantially hemispherical rear surface conforming to the substantially hemispherical frontal surface of the first part, wherein the second part is attached to at least a central part of the first part.

5. The package according to claim 1, wherein the block is fixed on the integrated-circuit chip support by means of a transparent adhesive layer.

6. The package according to claim 5, wherein the thickness of the adhesive layer is calibrated.

7. The package according to claim 1, further comprising a spacer interposed between the block and the chip support.

8. The package according to claim 7, wherein the spacer comprises a ring placed around and at a distance from the optical sensor.

9. The package according to claim 1, wherein the diaphragm is fixed between the block and the lens by means of a transparent adhesive layer.

10. The package according to claim 9, wherein the thickness of the adhesive layer is calibrated.

11. The package according to claim 9, wherein the adhesive layer is placed in an orifice of the diaphragm.

12. The package according to claim 1, wherein the peripheral wall of the housing encloses the periphery of the integrated-circuit chip support.

13. The package according to claim 1, wherein the peripheral wall of the housing extends as far as the front face of the integrated-circuit chip support.

14. The package according to claim 1, wherein the housing is fixed on the stack by means of an annular layer.

15. The package according to claim 1, wherein the block is made of glass or a plastic material.

16. The package according to claim 1, wherein the lens is made of glass or a plastic material.

17. The package according to claim 1, wherein the chip support comprises through-vias for electrical connection of the chip and electrical connection beads welded on a rear part of these vias.

18. An optical device for placement in front of an integrated-circuit chip support having an optical sensor of its front face, the device comprising a stack formed of:
    a transparent block having a rear face fixed on the front face of the chip support and a front face parallel to its rear face,
    a converging lens having a rear face fixed on the front face of the block, comprising:
        a first lens part having a substantially hemispherical frontal surface and the rear face; and
        a second lens part having substantially hemispherical rear surface conforming to the substantially hemispherical frontal surface of the first lens part and a convex frontal surface, and
    a diaphragm interposed and fixed between the block and the lens.

19. The device according to claim 18, wherein the convex frontal surface of the lens is aspherical.

20. The device according to claim 18, wherein the substantially hemispherical rear surface of the second part is attached to at least a central part of the substantially hemispherical frontal surface of the first part.

21. The device according to claim 18, wherein the lens is monoblock.

22. The device according to claim 18, wherein the block further includes a spacing ring on its rear face opposite from the diaphragm.

23. The device according to claim 18, wherein the diaphragm is fixed between the block and the lens by means of a transparent adhesive layer.

24. The device according to claim 23, wherein a thickness of the adhesive layer is calibrated.

25. The device according to claim 18, wherein the block is made of glass or a plastic material.

26. The device according to claim 18, wherein the lens is made of glass or a plastic material.

27. An optical assembly, comprising:
    a transparent block having opposed first and second faces;
    a diaphragm including a central aperture and a first face attached to the first face of the transparent block; and
    a lens having a rear face attached to a second face of the diaphragm, wherein the lens comprises:
        a first lens part having a substantially hemispherical frontal surface and the rear face; and
        a second lens part having substantially hemispherical rear surface conforming to the substantially hemispherical frontal surface of the first lens part and a convex frontal surface.

28. The optical assembly of claim 27 wherein the second part of the lens comprises a covering aspherical structure over the first lens part.

29. The optical assembly of claim 27 further including a plurality of micro-lenses positioned adjacent to the second face of the transparent block.

30. The optical assembly of claim 29 further including an optical integrated circuit assembly positioned adjacent to the second face of the transparent block and to which the plurality of micro-lenses are affixed.

31. The optical assembly of claim 30 further including a spacer for providing a calibrated distance between the second face of the transparent block and the plurality of micro-lenses.

32. The optical assembly of claim 27 further including an optical integrated circuit assembly positioned adjacent to the second face of the transparent block.

33. The optical assembly of claim 32 further including an adhesive layer for mounting the second face of the transparent block to the optical integrated circuit assembly.

34. The optical assembly of claim 33 wherein the adhesive layer is calibrated to set a distance between the second face of the transparent block to the optical integrated circuit assembly.

35. The optical assembly of claim 34 further including a spacer for providing the calibration.

36. The optical assembly of claim 27 further including a peripheral wall surrounding the transparent block, diaphragm and lens, the peripheral wall including a radially extending ledge portion that engages a periphery of the lens.

* * * * *